United States Patent
Nayfeh et al.

(10) Patent No.: US 10,844,921 B2
(45) Date of Patent: Nov. 24, 2020

(54) EXACT CONSTRAINT FOR FLEXIBLE BODIES

(71) Applicants: Samir Ali Nayfeh, Shrewsbury, MA (US); Justin Matthew Verdirame, Durham, NC (US)

(72) Inventors: Samir Ali Nayfeh, Shrewsbury, MA (US); Justin Matthew Verdirame, Durham, NC (US)

( * ) Notice: Subject to any disclaimer, the term of this patent is extended or adjusted under 35 U.S.C. 154(b) by 848 days.

(21) Appl. No.: 15/338,428

(22) Filed: Oct. 30, 2016

(65) Prior Publication Data

US 2017/0122400 A1  May 4, 2017

Related U.S. Application Data

(60) Provisional application No. 62/249,282, filed on Nov. 1, 2015.

(51) Int. Cl.
  *F16F 1/14* (2006.01)
  *G03F 7/20* (2006.01)
  *F16F 15/02* (2006.01)

(52) U.S. Cl.
  CPC .............. *F16F 1/14* (2013.01); *F16F 15/02* (2013.01); *G03F 7/707* (2013.01); *F16F 2228/04* (2013.01); *F16F 2230/0041* (2013.01); *F16F 2230/0052* (2013.01); *F16F 2230/34* (2013.01)

(58) Field of Classification Search
  CPC .... F16F 15/06; F16F 15/00; F16F 1/14; F16F 2230/34; F16F 2230/0052; F16F 2228/04; F16F 2230/0041; F16F 2226/048; G03F 7/707
  USPC .............. 248/636, 638, 646, 671, 144, 605; 269/21, 94
  See application file for complete search history.

(56) References Cited

U.S. PATENT DOCUMENTS

| | | | | |
|---|---|---|---|---|
| 3,913,937 A | * | 10/1975 | Longworth | B60G 7/04 280/680 |
| 4,824,138 A | * | 4/1989 | Rappold | B60G 5/047 280/682 |
| 5,324,012 A | * | 6/1994 | Aoyama | B25B 11/005 269/21 |
| 2014/0353936 A1 | * | 12/2014 | Preijert | B60G 9/00 280/124.116 |
| 2014/0353942 A1 | * | 12/2014 | Armstrong | B60P 3/36 280/475 |
| 2016/0152106 A1 | * | 6/2016 | Preijert | B60G 11/04 280/124.116 |
| 2019/0235389 A1 | * | 8/2019 | Lai | G03F 7/70458 |
| 2019/0277364 A1 | * | 9/2019 | Lammi | B64C 11/008 |

OTHER PUBLICATIONS https://books.google.com/books?id=fbyCcHPI0nsC&pg=PA133&lpg=PA133&dq=%22free+mode+shape%22&source=bl&ots=ak7_tpjc48&sig=ACfU3U2ZHUNQkFfHR048xHx9BCOv6459EQ&hl=en&sa=X&ved=2ahUKEwijqvO5wKLnAhVUj3IEHSVMBLAQ6AEwB3oECAgQAQ#v=onepage&q&f=false, Tony L. Schmitz & K. Scott Smith published on Sep. 17, 2011 (Year: 2011).*

* cited by examiner

*Primary Examiner* — Muhammad Ijaz

(57) ABSTRACT

This invention relates to the constraint of a flexible body with low distortion and low uncertainty in its location. A class of mechanisms involving at least one pivot rocker is disclosed. These mechanisms fully constrain a body in space, but when constrained allow the flexible body to vibrate in the shape of one or more of its free mode shapes. Such a set of constraints yields a constrained system with high natural frequencies without over-constraining the body.

4 Claims, 11 Drawing Sheets

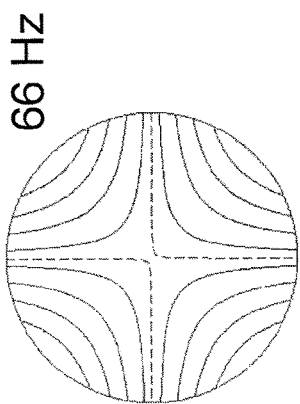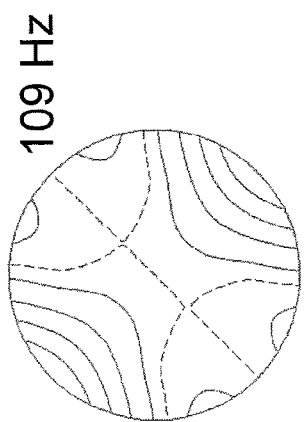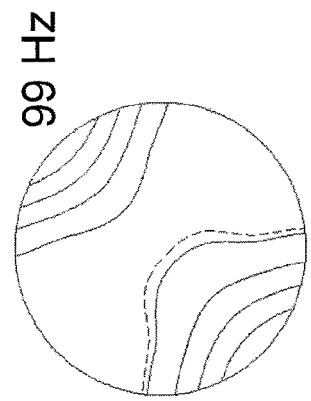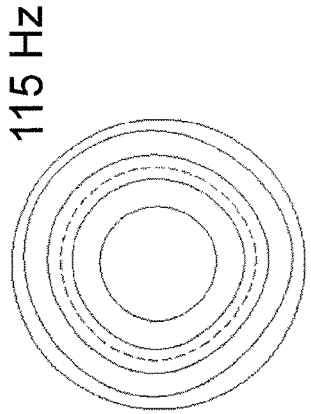

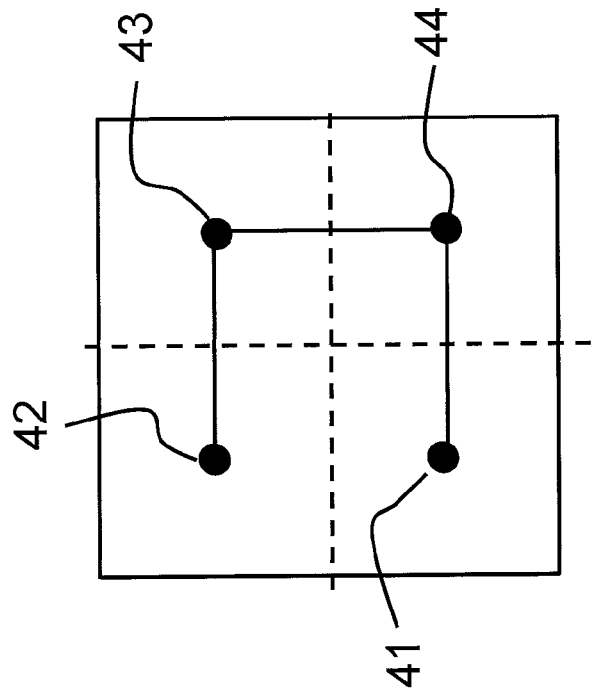
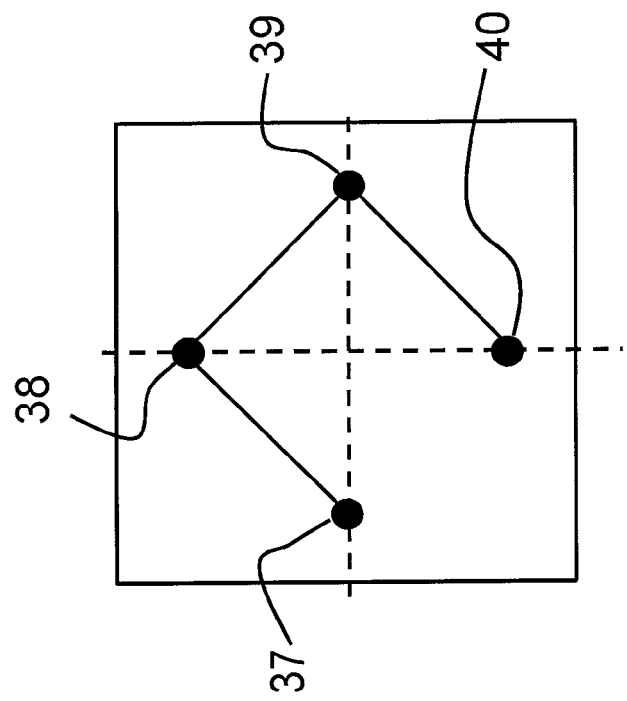

US 10,844,921 B2

EXACT CONSTRAINT FOR FLEXIBLE BODIES

This application claims the benefit of U.S. Provisional Application No. 62/249,282 filed Nov. 1, 2015.

FIELD OF THE INVENTION

This invention is related to the constraint of substrates, optics, or other mechanical components with low distortion and low levels of vibration.

BACKGROUND OF INVENTION

In many mechanical assemblies, it is desirable to limit the deformation and position uncertainty of a body within the assembly. For example, it is often necessary to mount or manipulate a mirror, lens, or substrate with low distortion and low uncertainty in its location.

It is therefore common to apply exact-constraint (often referred to as kinematic) design principles in the design of structures, mounts, or grippers. In its simplest form, each body is considered rigid, and therefore each body has six degrees of freedom: displacement in three directions and rotation about three axes. To constrain a body according to exact-constraint design principles requires six constraints with the constraints applied at a discrete set of contact locations, where the contact locations are small compared to the overall dimensions of the body. See Blanding, D. L., *Exact constraint: machine design using kinematic principles.* ASME Press, 1999.

Real bodies are flexible and therefore susceptible to vibration, which often limits the performance of a machine or assembly. Among the most common methods for limiting the vibration of a body is to design it so that its resonant frequencies are as high as possible. But because exact-constraint design principles limit the number of locations where a flexible body is supported, there is often a difficult trade off between achieving a design that approximates exact constraint and attainment of high resonance frequencies.

A common requirement in precision machines is to constrain a plate-like structure or substrate, such as a silicon wafer, a mask, or a mirror. For plate-like structures, it is common to violate exact-constraint principles in the plane of the structure where it is relatively stiff, but to obey the exact-constraint principles in the direction normal to that plane. In such instances, we can restrict discussion to provision of three constraints in the direction normal to the plane of the structure.

For example, a silicon wafer 1 with radius R as shown in FIG. 1 would commonly be constrained from moving in the direction normal to the plane of the wafer at three points symmetrically located at points 2, 3, and 4. The radius r at which the three supports are placed can be varied to obtain the dependence of the first natural frequency on r as shown in FIG. 2. The highest attained resonance is 52 Hz and is obtained at r/R≈0.4. This is about 20% lower than the maximum resonant frequency than can be obtained using present invention. The first four mode shapes attained with supports at this location are shown in FIGS. 3A-D.

SUMMARY OF THE INVENTION

The present invention provides a method and embodiments for constraining flexible bodies according to exact-constraint design principles while attaining the theoretical maximum resonant frequency. For plate-like structures, a set of three pivot rockers placed to preserve the free modes of the structure attain the maximum resonant frequency.

BRIEF DESCRIPTION OF DRAWINGS

FIGS. 7A-E are contours plots of the mode shapes corresponding to the first five natural frequencies of a 300 mm diameter 0.775 mm thick silicon wafer constrained by the mechanism of the first embodiment with nodal lines shown as dashed curves.

FIGS. 11A-B are top views of a square substrate supported at four points according to the third and fourth embodiments.

DETAILED DESCRIPTION OF EMBODIMENTS

The Courant Minimax Principle is a mathematical principles summarized as follows: "If a linear constraint is applied to a system, each natural frequency increases, but does not exceed the next natural frequency of the original system." See Gladwell, G. M. L., *Inverse problems in vibration.* Springer, Netherlands, 2005. p. 40-46. Therefore, if the natural frequencies of a flexible body before addition of a constraint are written in sequence as $\lambda_1, \lambda_2, \lambda_3 \ldots$ and the natural frequencies of the flexible body after addition of a constraint are written as $\lambda'_1, \lambda'_2, \lambda'_3 \ldots$, the new natural frequencies must obey $$\lambda_1 \leq \lambda'_1 \leq \lambda_2, \lambda_2 \leq \lambda'_2 \leq \lambda_3, \lambda_3 \leq \lambda'_3 \leq \lambda_4 \tag{1}$$

and so on. From the Courant Minimax Principle, we further find that a constraint which renders $\lambda'_1 = \lambda_2$ must exist. This is referred to as the limit natural frequency.

In the first embodiment, a circular substrate (e.g., a silicon wafer) 1 is exactly constrained in the plane normal to the wafer surface with maximum natural frequency. Before these constraints are added, the circular substrate is free to vibrate in the direction normal to its surface, and the first three free mode shapes have zero natural frequency. The first three free mode shapes with non-zero natural frequency are shown in FIGS. 4A-C.

Figure 1:
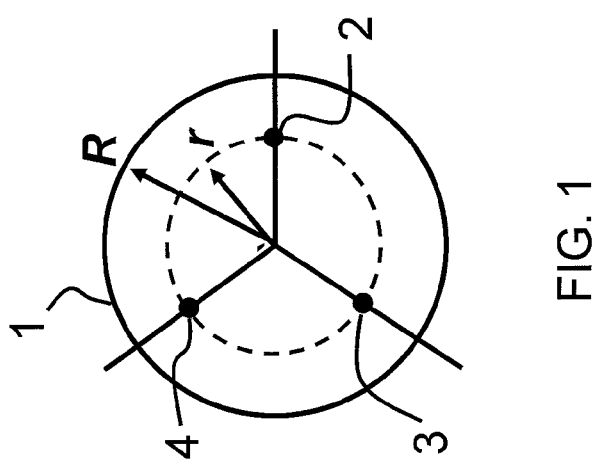
FIG. 1 is a top view of a circular substrate of radius R supported at three points.
Figure 2:
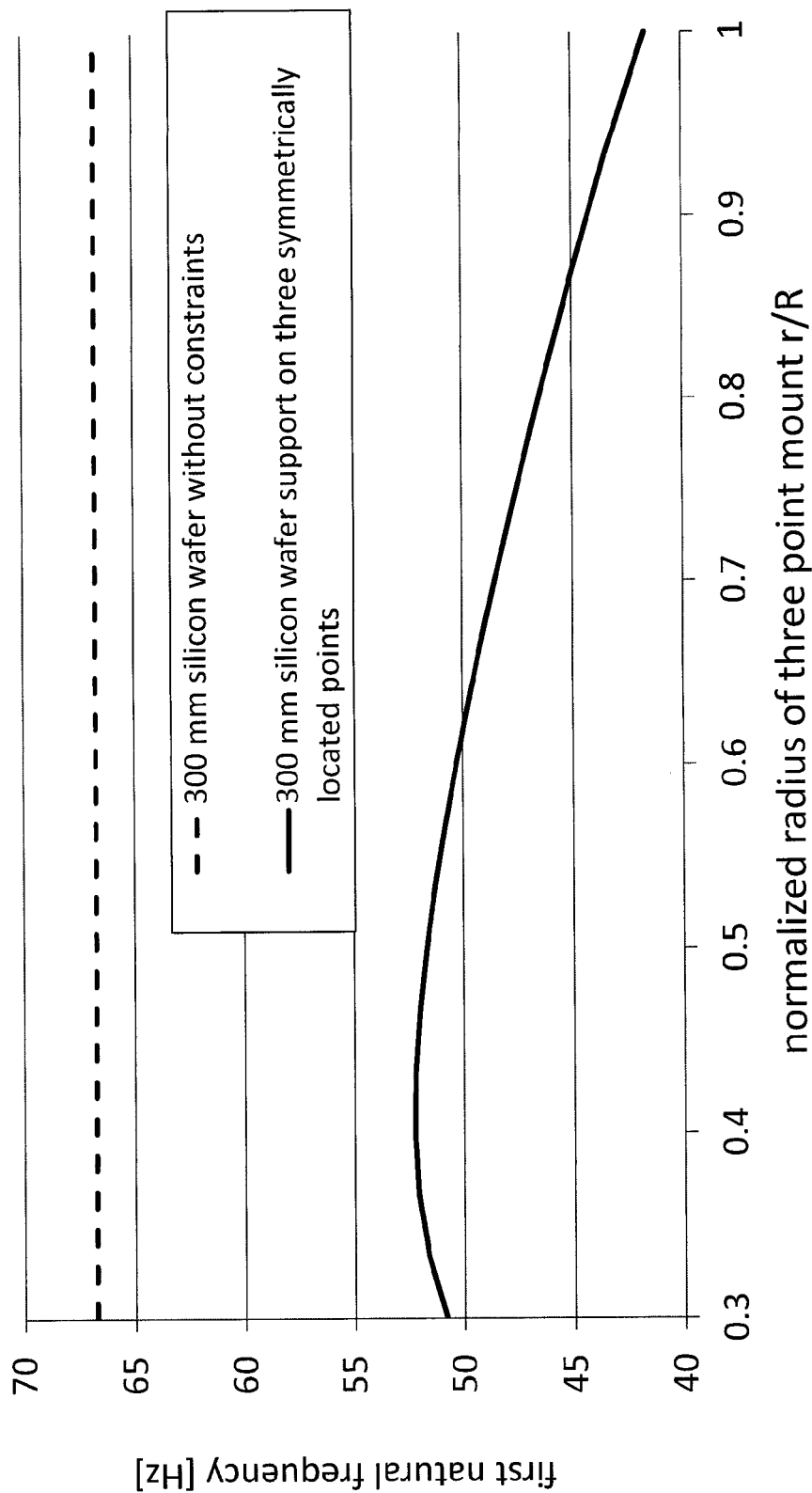
FIG. 2 is a graph showing the variation with support radius of the first natural frequency of a 300 mm diameter 0.775 mm thick silicon wafer.
Figure 3A:
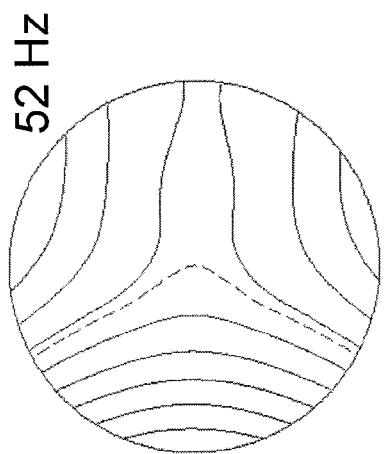
FIGS. 3A-D are contour plots of the mode shapes of a 300 mm diameter 0.775 mm thick silicon wafer supported on three points at radius of 60 mm with nodal lines shown by dashed curves.
Figure 3B:
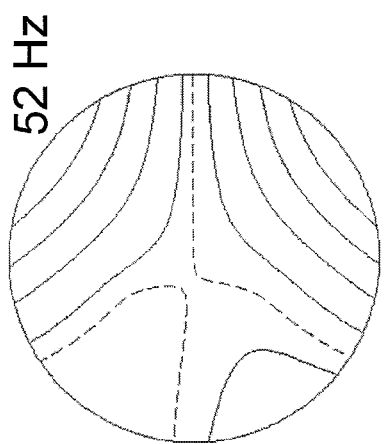
Figure 3C:
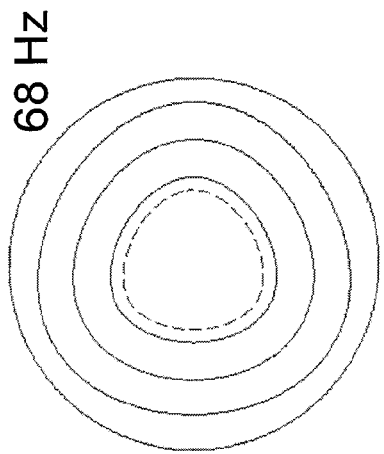
Figure 3D:
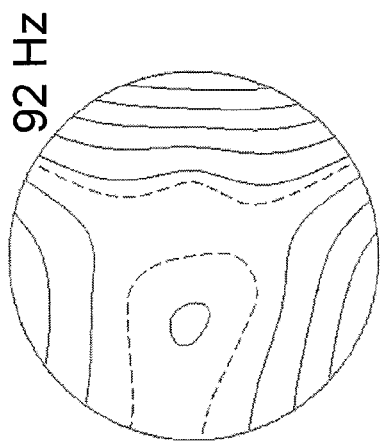
Figure 4A:
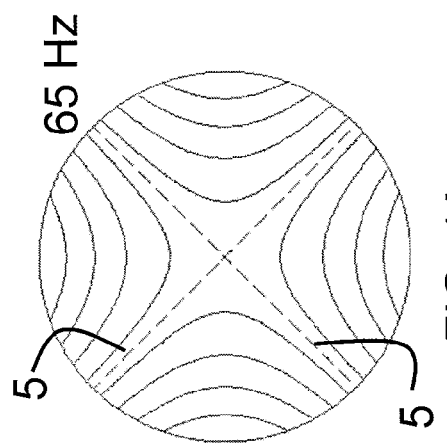
FIGS. 4A-C are contour plots of the mode shapes corresponding to the first three non-zero free natural frequencies of a 300 mm diameter 0.775 mm thick silicon wafer with nodal lines shown by dashed curves.
Figure 4B:
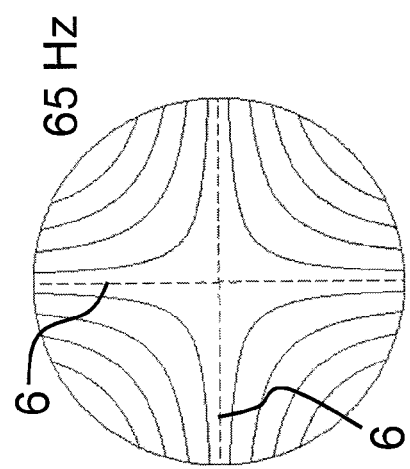
Figure 4C:
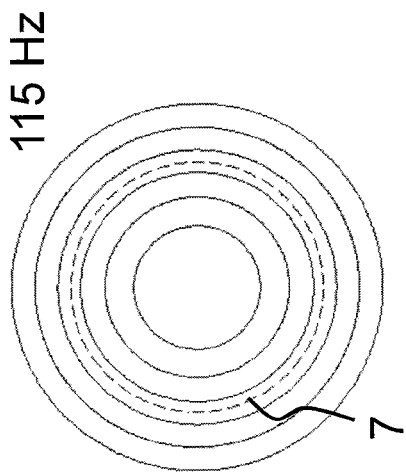

According to the Courant Minimax Principle, three constraints that render the first two natural frequencies of the constrained system equal to the first two non-zero free natural frequencies of FIGS. 4A and 4B can be obtained. But the nodal lines 5 and 6 of repeated natural frequencies of FIGS. 4A and 4B do not intersect accept at the center of the circular substrate. Therefore, it is not possible to constrain three points under the plate without constraining the circular substrate from moving in the shape of these modes.

Figure 5:
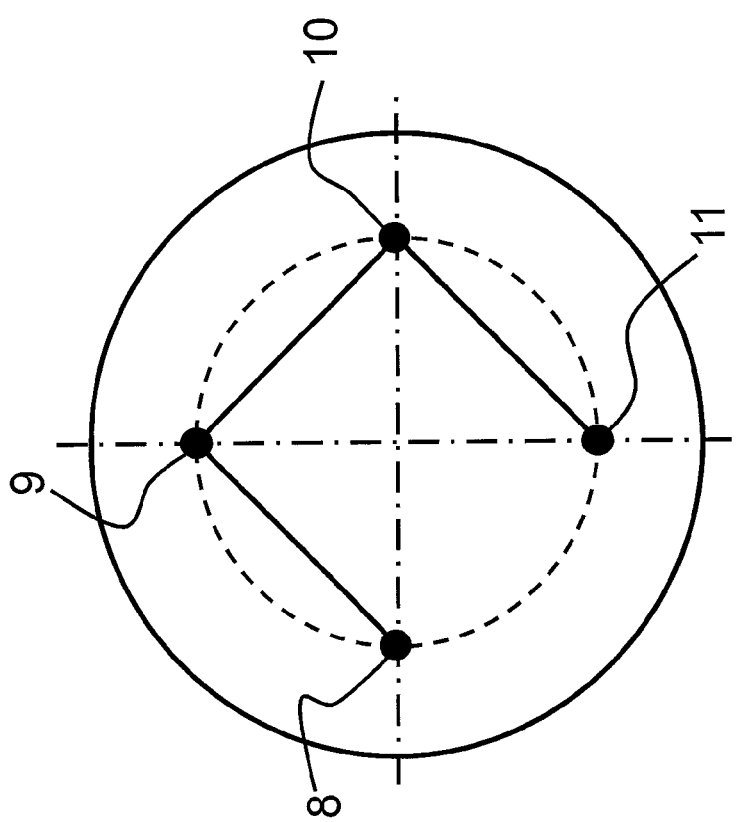
FIG. 5 is a top view of a circular substrate of supported at four points according to the first embodiment.

In the first embodiment we choose the four points 8, 9, 10, and 11 as shown in FIG. 5 and synthesize a mechanism that enforces constraints on the displacements $w_8$, $w_9$, $w_{10}$ and $w_{11}$ at each respective point in the direction normal to the wafer surface according to $$w_8 = -w_9, \ w_9 = -w_{10}, \text{ and } w_{10} = -w_{11} \quad (2)$$

Figure 6:
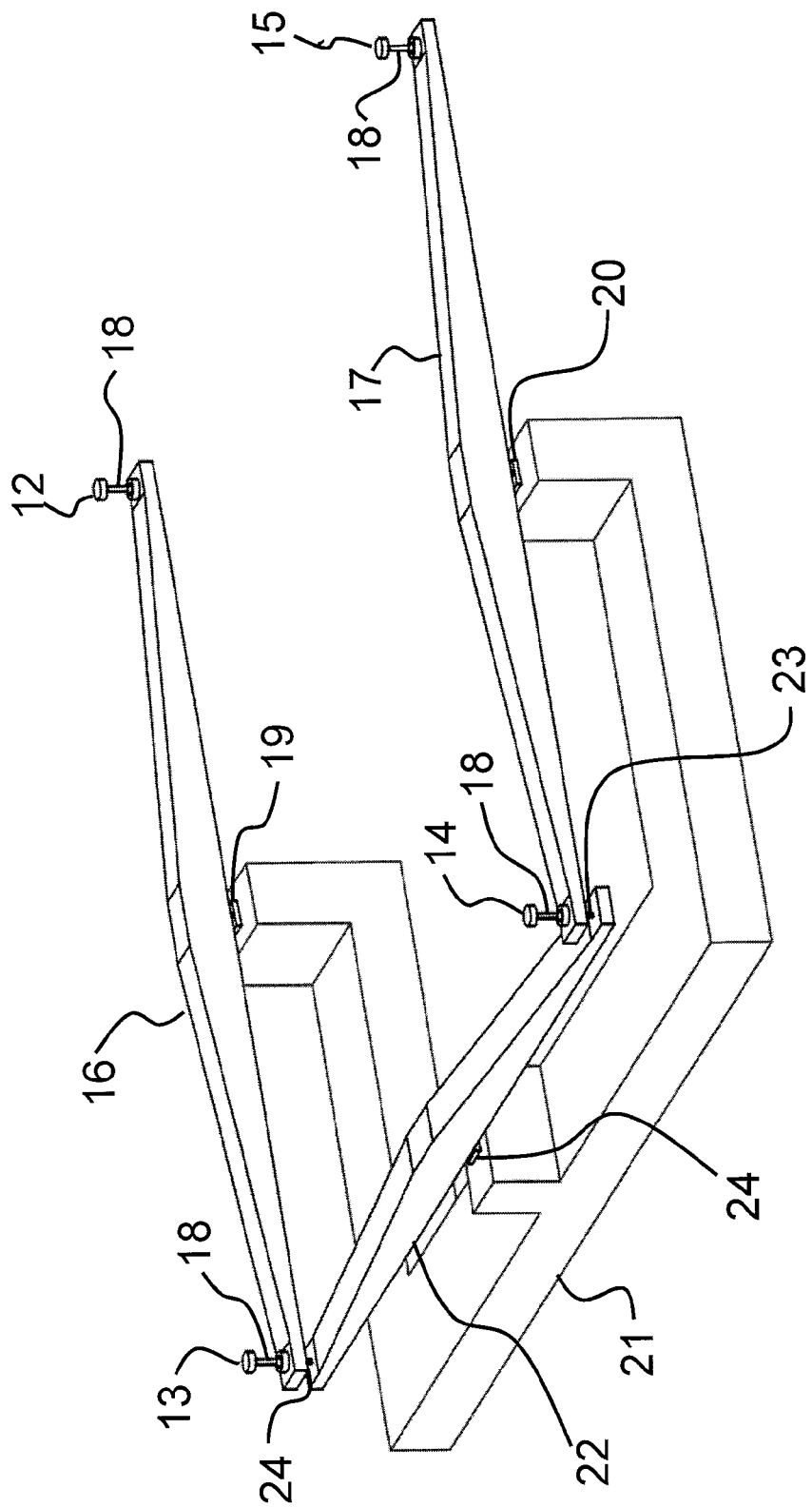
FIG. 6 is an isometric view of the constraint mechanism of the first embodiment.

A drawing of such a system is shown in FIG. 6, where the contacts 12, 13, 14, and 15 are in the form of rounded pads that would contact the circular substrate at point 8, 9, 10 and 11 respectively. These contact pads could be replaced by vacuum pads or other means of attachment in many applications.

The contacts 12, 13, 14, and 15 are attached to pivot rockers 16 and 17 by means of hourglass flexures 18. These allow the pivot rockers to rotate about flexural pivots 19 and 20 attached to base 21 without causing the contacts 12, 13, 14, and 15 to slip against the substrate 1. The pivot rockers 16 and 17 are connected by means of a third pivot rocker 22 by means of hourglass flexure pivots 23 and 24, and pivot rocker 22 is attached to base 21 by means of flexural pivot 25.

A three-dimensional finite-element analysis of the embodiment as shown in FIG. 6 with the pivot arms and flexure pivots constructed of stainless steel and the circular substrate a 0.775 mm thick silicon wafer with 300 mm diameter yields the modes shown in FIGS. 7A-E, from which we see that it is a good approximation to the constraint set of Eq. (2), and that such a constraint system does yield the first two modes of the constrained wafer equal to the modes of unconstrained circular substrate of FIGS. 4A and 4B.

Figure 8B:
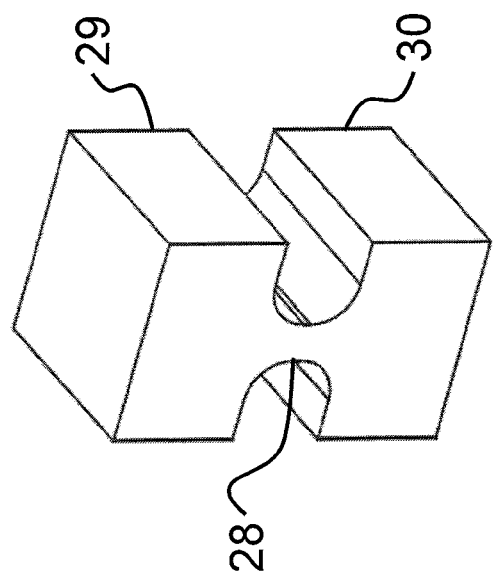
FIG. 8B is an isometric view of a flexure pivot.
Figure 8A:
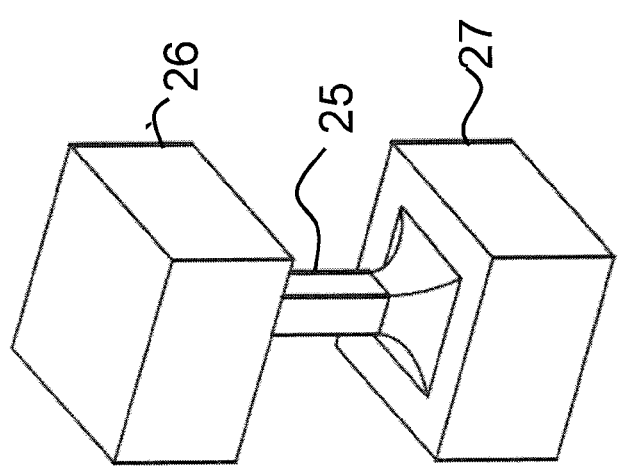
FIG. 8A is an isometric view of an hourglass flexure.

The hourglass flexure 18 may be constructed as shown in FIG. 8A. A narrow link 25 is formed in a material so that the two thicker portions 26 and 27 are constrained from moving relative to each other in the direction along the axis of narrow link 25. But the thicker portions of material 26 and 27 can move relative to each other transverse to the axis of narrow link 25 or to rotate relative to each other by flexing or twisting narrow link 25. The narrow link may be square in cross section as shown in FIG. 8A or round. Its dimensions and material can be varied as known in the art to accommodate a desired range of motion without damage to the material. The narrow link 25 can be formed of a single material with the thicker portions 26 and 27, or joined for example by brazing. Many other forms of flexures or pivots involving balls and sliding surfaces could be employed in place of this particular hourglass flexure.

The flexure pivots 19, 20, and 25 may be constructed as shown in FIG. 8B. The narrow link 28 is narrow in only one direction, so that the thicker portions 29 and 30 can rotate relative to each other by bending the narrow link in its thin direction. But the thicker portions 29 and 30 are substantially constrained from moving relative to each other in translation or from rotating relative to each other in any direction other than the thin direction of the link. The narrow link 28 can be formed of a single material with the thicker portions 26 and 27, or joined, for example by brazing. Many other forms of flexures or pivots involving balls and sliding surfaces could be employed in place of this particular flexure pivot.

The condition given by Eq. 2 could be realized with points 8, 9, 10, and 11 at any radius from the center, and therefore the constraint mechanism can avoid constraining the modes of FIGS. 4A and 4B with the supports at any radius. In this embodiment, we have chosen to place the constraints 8, 9, 10, and 11 at the same radius as the nodal line of the 3rd non-zero free mode of the circular substrate shown in FIG. 4C. This mode therefore appears substantially unaltered as the 5th mode of the constrained system as shown in FIG. 7E.

Figure 9A:
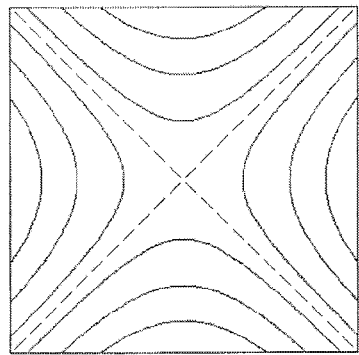
FIGS. 9A-C are contour plots of the mode shapes corresponding to the first three non-zero free natural frequencies of a square substrate with nodal lines shown by dashed curves.
Figure 9B:
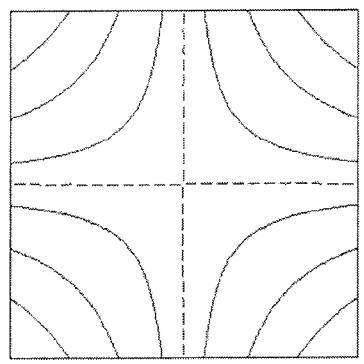
Figure 9C:
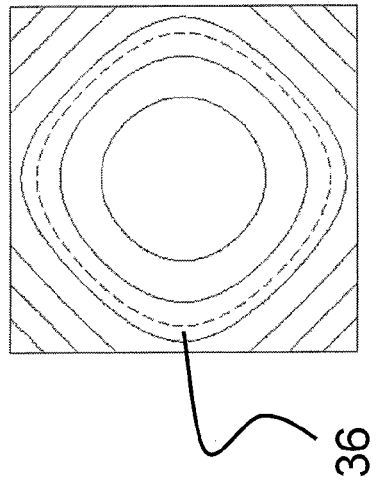
Figure 10:
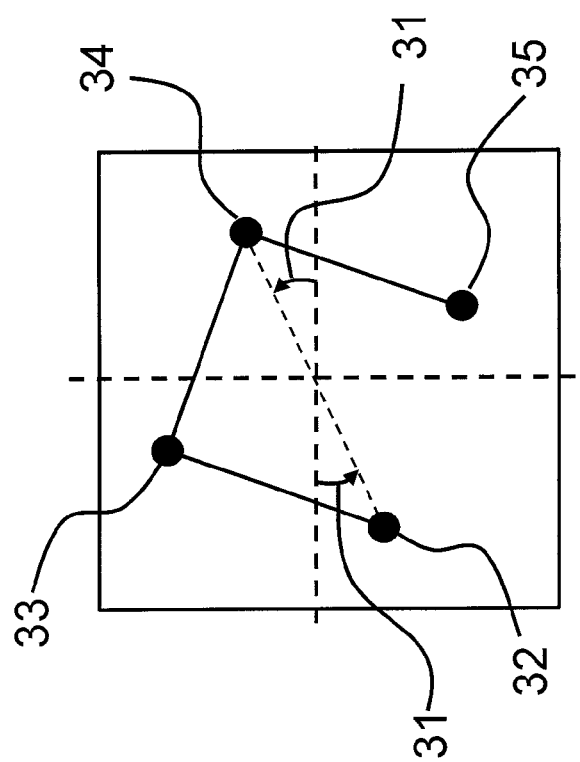
FIG. 10 is a top view of a square substrate supported at four points according to the second embodiment.

A second embodiment is now described with application to square plate-like structures. The first three free mode shapes with non-zero natural frequencies are shown in FIGS. 9A-C. The mechanism with three pivot rockers as shown in FIG. 6 can be used to constrain a square without constraining its first two free mode shapes with non-zero natural frequencies by positioning the pivot rockers so that the contacts are centered on the square as shown in FIG. 10. The angle of rotation as indicated by the angular measure 31 can take any value, so long as the rocker arms are sized so that the contacts 32-35 fall with radius greater than 0.15 times the length of a side of the square and less than 0.55 times the length of a side of the square.

In a third embodiment, the supports of the rocker arm are placed to fall on the nodal line 36 of the third free mode shape with non-zero natural frequency of FIG. 9C. The contacts 37-40 in this embodiment therefore are located as shown in FIG. 11A, where they are located at a radius of approximately 0.41 times the length of a side of the square. Or the contacts 41-44 can be located as shown in FIG. 11B, where they are located at a radius of approximately 0.39 times the length of a side of the square. This embodiment therefore does not constrain the substrate from deforming in the shape of any of its first three free mode shapes with non-zero natural frequency.

A rectangle with aspect ratio of less than 1.4:1 has mode shapes qualitatively like those of the square, and therefore the same constraint method as shown in the previous embodiments yields the same result by modification of the dimensions of the rocker arms.

It should also be noted that whereas in many instances it is advantageous to limit the number of contact points to the flexible body, an equivalent set of constraints could be obtained with shorter rocker arms with each rocker arm contacting the flexible body at two locations. Such a configuration could be advantageous in limiting the sag of the flexible body under gravity loading or in minimizing the lengths of the rocker arms.

The scope of this invention extends beyond the examples shown herein. The plate-like structure could be integral or affixed to the rocker arms or be a removable substrate supported under gravity or by other means such as vacuum clamps. The pivot rocker arrangement could form a static structure or a dynamically actuated mechanism where actuators are included at any of the supports. Embodiments involving only one or two pivot rockers and some number of fixed supports may also be used in some cases. The geometry of the plate-like structure could be considerably more complex than the simple circle or square and could have almost any exterior shape, holes, ribs, or reinforcement.

What is claimed is:

1. A mechanism for constraining a flexible body comprising:

the flexible body;

a first pivot rocker, a second pivot rocker, and a third pivot rocker, each of which has a pivot connection to a base, an axis of each said first, second and third pivot rockers oriented parallel to a common plane;

wherein the first pivot rocker is connected to the second pivot rocker with a first joint that constrain said first and second pivot rockers to move together in a direction normal to said common plane at a location of the pivot connection;

the first pivot rocker is connected to the third pivot rocker with a second joint that constrain said first pivot rocker and said third pivot rocker to move together in the direction normal to said common plane at a location of the second joint connection, the second pivot rocker is connected to the flexible body at two locations, and the third pivot rocker is connected to the flexible body at another two locations.

2. A method for constraining motion of a flexible body, the method comprising: determining a plurality of free natural frequencies and associated free mode shapes of the flexible body when not constrained by a mechanism, synthesizing the mechanism including at least one, pivot rocker configured to constrain at least one point on the flexible body in at least one degree of freedom, configuring the mechanism so that it does not substantially constrain the flexible body from deforming in the shape of at least one of its free mode shapes associated with a non-zero free natural frequency.

3. The method according to claim 2, wherein the at least one free mode shape is associated with a lowest non-zero free natural frequency of said plurality of free natural frequencies.

4. The method according to claim 2, wherein the at least one free mode shape is associated with any lowest twelve non-zero free natural frequencies of said plurality of free natural frequencies.

* * * * *